United States Patent
Kawanishi et al.

(10) Patent No.: US 7,352,117 B2
(45) Date of Patent: Apr. 1, 2008

(54) PIEZOELECTRIC VIBRATOR

(75) Inventors: Shingo Kawanishi, Sayama (JP); Minoru Ishihara, Kawagoe (JP); Kozo Ono, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 12 days.

(21) Appl. No.: 11/346,417

(22) Filed: Feb. 2, 2006

(65) Prior Publication Data

US 2006/0186768 A1 Aug. 24, 2006

(30) Foreign Application Priority Data

Feb. 2, 2005 (JP) ............... 2005-026099

(51) Int. Cl.
*H03H 9/21* (2006.01)

(52) U.S. Cl. ............... 310/370; 333/200; 73/504.02

(58) Field of Classification Search ............... 310/370; 333/200; 331/156; 73/504.16
See application file for complete search history.

(56) References Cited

U.S. PATENT DOCUMENTS

| 6,587,009 | B2 | 7/2003 | Kitamura et al. | |
|---|---|---|---|---|
| 6,724,271 | B2* | 4/2004 | Sakata et al. | 331/156 |
| 6,897,737 | B2* | 5/2005 | Sakata et al. | 331/156 |
| 7,015,630 | B2 | 3/2006 | Tanaya | |
| 7,168,319 | B2* | 1/2007 | Dalla Piazza et al. | 73/504.16 |
| 2002/0121941 | A1* | 9/2002 | Sakata et al. | 331/154 |
| 2004/0263027 | A1 | 12/2004 | Kawashima | |
| 2006/0214749 | A1* | 9/2006 | Yamada | 333/200 |

FOREIGN PATENT DOCUMENTS

| JP | 52-052597 | 4/1977 |
|---|---|---|
| JP | 2002-261575 | 9/2002 |
| WO | WO-2004/064252 | 7/2004 |

\* cited by examiner

*Primary Examiner*—J. San Martin
(74) *Attorney, Agent, or Firm*—Jordan and Hamburg LLP

(57) ABSTRACT

A tuning fork type piezoelectric vibrator is provided with vibrating arms which can improve shock resistance while suppressing a CI value to a small value. A first groove (base end side) and a second groove (tip side) extend along a longitudinal direction from a base end of the vibrating arm and are formed on at least one of a front surface or a back surface of the vibrating arms. Then, a ratio L2/L1 which is the ratio of a length L2 of the first groove to a length L1 from the base end of the vibrating arm to the tip of the second groove, is set between 0.35 and 0.65, and a ratio d/L1 which is the ratio of a space d between the first groove and the second groove to the length L1 from the base end of the vibrating arm to the tip of the second groove, is set between 0.010 and 0.016.

4 Claims, 7 Drawing Sheets

PIEZOELECTRIC VIBRATOR

TECHNICAL FIELD

The present invention relates to a piezoelectric vibrator in which two vibrating arms are extended from a base to form in a tuning fork type vibrator.

BACKGROUND ART

The piezoelectric vibrator of this kind, such as a tuning fork type quartz vibrator is generally known as a signal source ticking a clock rate of a wrist watch, and has been adopted as a synchronizing signal source of portable electronic devices in recent years. Further miniaturization of quartz vibrators is required with miniaturization of such electronic devices.

The configuration of a tuning fork type quartz vibrator is described in Patent Document 1. In the configuration of the tuning fork type quartz vibrator shown in FIG. 9, tuning fork arms 2a and 2b serving as a pair of vibrating arms are provided on a base 1, and grooves 3 are provided on both main surfaces of the respective turning fork arms 2a and 2b. Excitation electrodes to excite tuning fork vibration based on winding vibrations of the respective tuning fork arms 2a and 2b are provided on the grooves 3 and both side surfaces of the respective tuning fork arms 2a and 2b. The excitation electrodes are connected so that a side surface of one tuning fork arm 2a and the inside of the groove 3 of the other tuning fork arm 2b are at the same potential, and the side surface of the other tuning fork arm 2b and the inside of the groove 3 of the other tuning fork arm 2a are at opposite potentials when electric charges are given to the tuning fork type vibrator.

By using such a tuning fork type quartz vibrator, an electric field intensity in the X-axis direction (width direction of the tuning fork arm) is increased compared with the case of not forming the grooves 3. Accordingly, a winding vibration in the Y-axis direction (in the length direction of a tuning fork arm) mutually expanding and contracting in the opposite direction between both side surfaces of the respective tuning fork arms 2a and 2b is strongly excited.

By configuring the vibrator in this manner, vibration loss of the tuning fork arms 2a and 2b becomes low, and therefore, it is possible to obtain a piezoelectric vibrator having a basically favorable CI (crystal impedance) value.

However, further decrease in the CI value has been required due to a request for efficiency of the power consumption in electronic parts using the quartz vibrator. Furthermore, since the tuning fork type quartz vibrator described in the above-described Patent Document 1 has grooves on the tuning fork arms as described above, shock resistance is lessened when the quartz vibrator is miniaturized, and shock resistance against a drop or the like is low, which may possibly cause trouble such as damage when manufacturing electronic parts and so on.

Patent Document 1
Patent Application Laid-open No. 2002-261575

DISCLOSURE OF THE INVENTION

The present invention has been made to solve the above-described problems and an object thereof is to provide a piezoelectric vibrator of strong shock resistance but with a small CI value among tuning fork type piezoelectric vibrators having two vibrating arms.

A piezoelectric vibrator of the present invention having two vibrating arms extending from a base to form a tuning fork type, includes:

a groove extending along the longitudinal direction from the base end of the vibrating arm and divided into two in the longitudinal direction being formed on at least one of a front surface or a back surface of the vibrating arms; and a pair of excitation electrodes provided respectively on the side surface and inside the groove of the vibrating arm.

In the present invention, assuming that a groove on the base end side out of the grooves formed by dividing a groove into two in the longitudinal direction is a first groove and the other groove on the tip side is a second groove, it is preferable that a ratio L2/L1 is 0.35 to 0.65 where L2/L1 is the ratio of the length L2 of the first groove to the length L1 from the base end of the vibrating arm to the tip of the second groove. It is also preferable that a ratio d/L1 is 0.010 to 0.016 where d/L1 is the ratio of a space d between the first groove and the second groove to the length L1 from the base end of the vibrating arm to the tip of the second groove.

Further, a piezoelectric vibrator package of the present invention includes a package provided with the piezoelectric vibrator described above, and an electrode provided outside the package and electrically connected to the excitation electrode. Moreover, the piezoelectric oscillator of the present invention includes the piezoelectric vibrator described above, and an oscillation circuit oscillating the piezoelectric vibrator.

Since the groove in the vibrating arm is divided into two in the longitudinal direction in the present invention, it is possible to obtain great shock resistance while crystal impedance (CI value) of the piezoelectric vibration is made small, as clear from a later-described experimental result.

BEST MODE FOR CARRYING OUT THE INVENTION

First Embodiment

Figure 1:
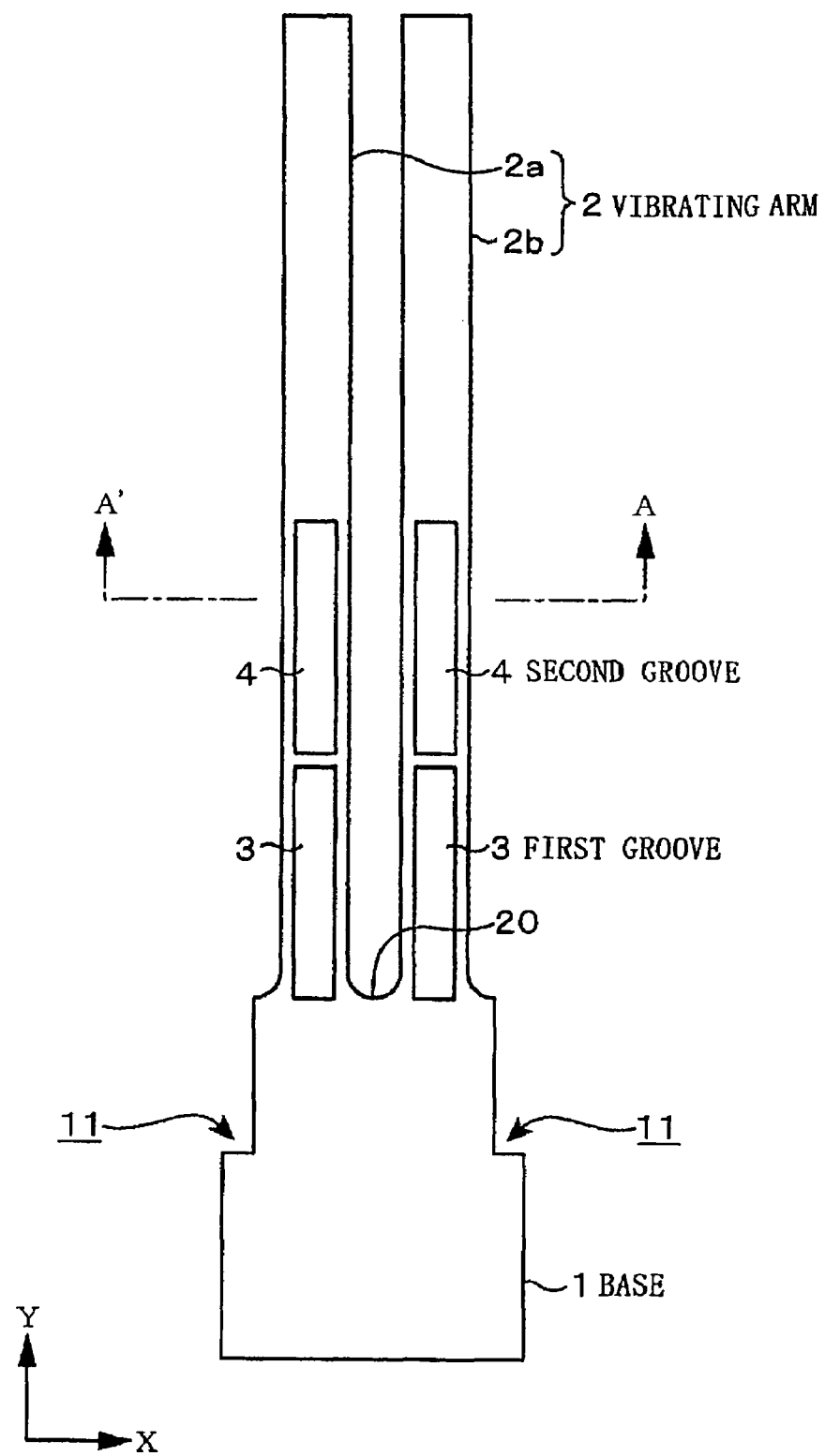
FIG. 1 is a schematic plan view showing a tuning fork type quartz vibrator relating to an embodiment of the present invention.

FIG. 1 is a diagram showing an embodiment of a tuning fork type quartz vibrator relating to the present invention. The quartz vibrator main body (a piece of quartz) in this quartz vibrator includes a substantially square base 1 serving also as a notch portion 11 in which an upper portion of both sides thereof is notched in a rectangle, and two vibrating arms 2 (2a and 2b) extend from an upper side of the base 1 in parallel with a space therebetween, and are formed in an entire shape as a tuning fork type quartz piece. Furthermore, a first groove 3 and a second groove 4 formed by dividing into two parts in the longitudinal direction from a base end of the respective vibrating arm 2 (2a and 2b) toward a tip are provided on a front surface and a back surface of the vibrating arms 2 (2a and 2b).

A shape of the base 1 between the pair of vibrating arms 2a and 2b is curved, and a position in the Y-direction of the base end of the first groove 3 is at a same position as that of a lowest portion (the tip side of the vibrating arms 2 is taken as an upper side) 20 of the curvature (fork portion of a tuning fork) as an example. However, it is also possible that the position is lower than this lowest portion 20 (a position closer to the base 1 side.

Figure 2:
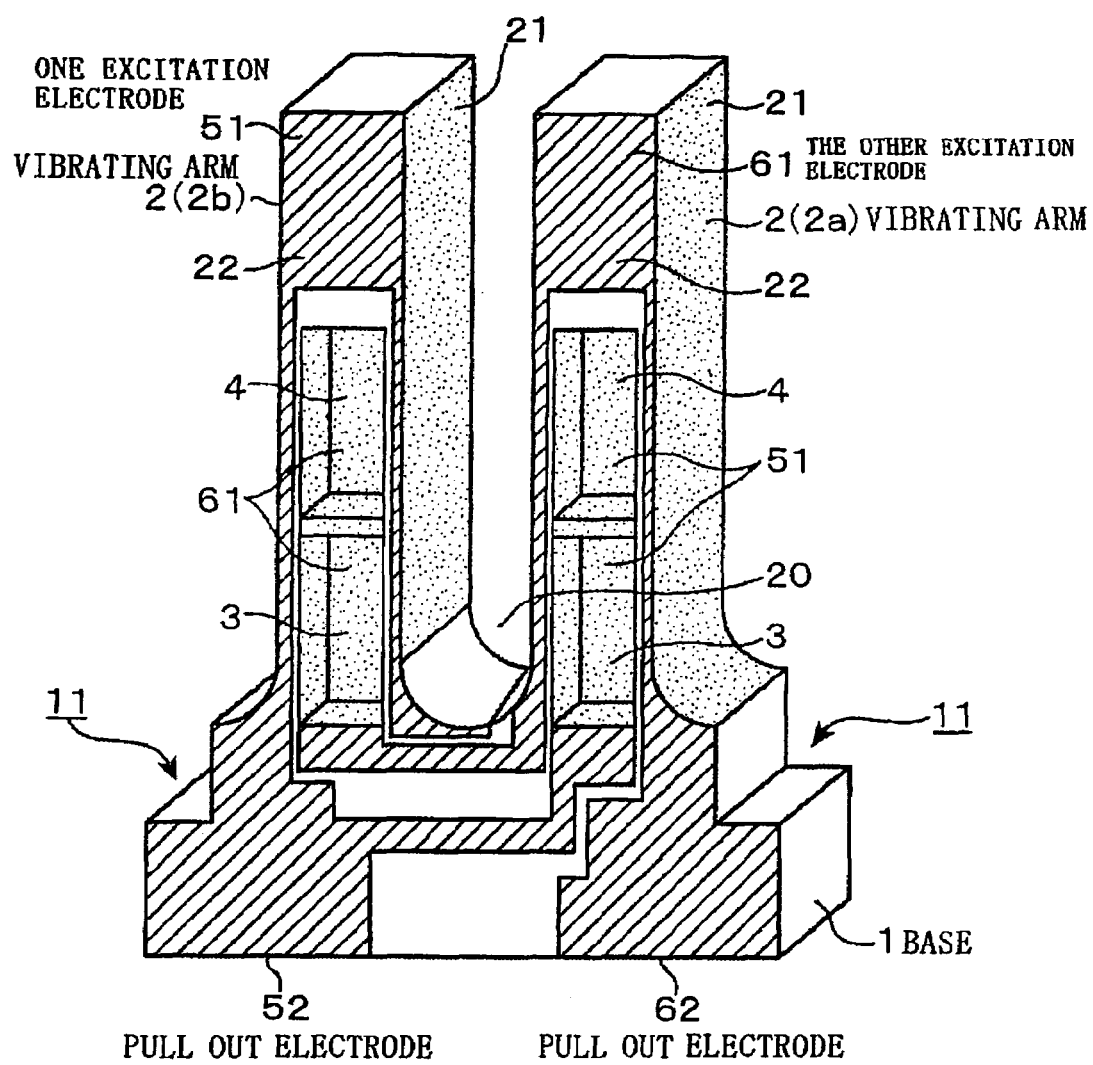
FIG. 2 is a perspective view showing a tuning fork type quartz vibrator relating to an embodiment of the present invention.

Excitation electrodes and pull out electrodes are described here referring to FIG. 2. One electrode and the other electrode forming a pair are provided in the quartz vibrator. Looking at vibrating arm 2a first, the above one excitation electrode 51 is formed over the entire inside surfaces of two grooves 3 and 4 of the vibrating arm 2a and between the grooves 3 and 4. In other words, a first excitation electrode 51 in the groove 3 of the vibrating arm 2a and a second excitation electrode 51 in the groove 4 of the vibrating arm 2a are connected by a third excitation electrode 51 formed between two grooves 3 and 4, namely, a bridge portion. The other excitation electrode 61 is formed on both side surfaces 21 and 21 of the vibrating arm 2a and on a portion upper than the second groove 4 on the tip side of the main surfaces 22 and 22 (a front surface and a back surface). Note that the excitation electrodes 51 and 61 in FIG. 2 are expressed with diagonal lines and black dotted areas for visual clarity. The diagonal lines in FIG. 2 are not intended to show a cross section.

Looking at the vibrating arm 2b then, the other vibrating electrodes 61 is formed over the entire inside surface of two grooves 3 and 4 of the vibrating arm 2b and between the grooves 3 and 4. The one excitation electrode 51 is formed on both side surfaces 21 and 21 of the vibrating arm 2b and on a portion upper than the second groove 4 on the tip side of the main surfaces 22 and 22 (a front surface and a back surface). The arrangement of the electrodes provided on the vibrating arms 2a and 2b is the same in both cases except that the vibrating electrodes 51 and 61 are in an opposite relation with each other. Moreover, a pattern formed of a pull out electrode 52 is formed on a front surface of the base 1 so that one pair of vibrating electrodes 51 are electrically connected with each other, and a pattern formed of a pull out electrode 62 is formed on the front surface of the base 1 so that the other pair of vibrating electrodes 61 are electrically connected with each other.

Figure 3:
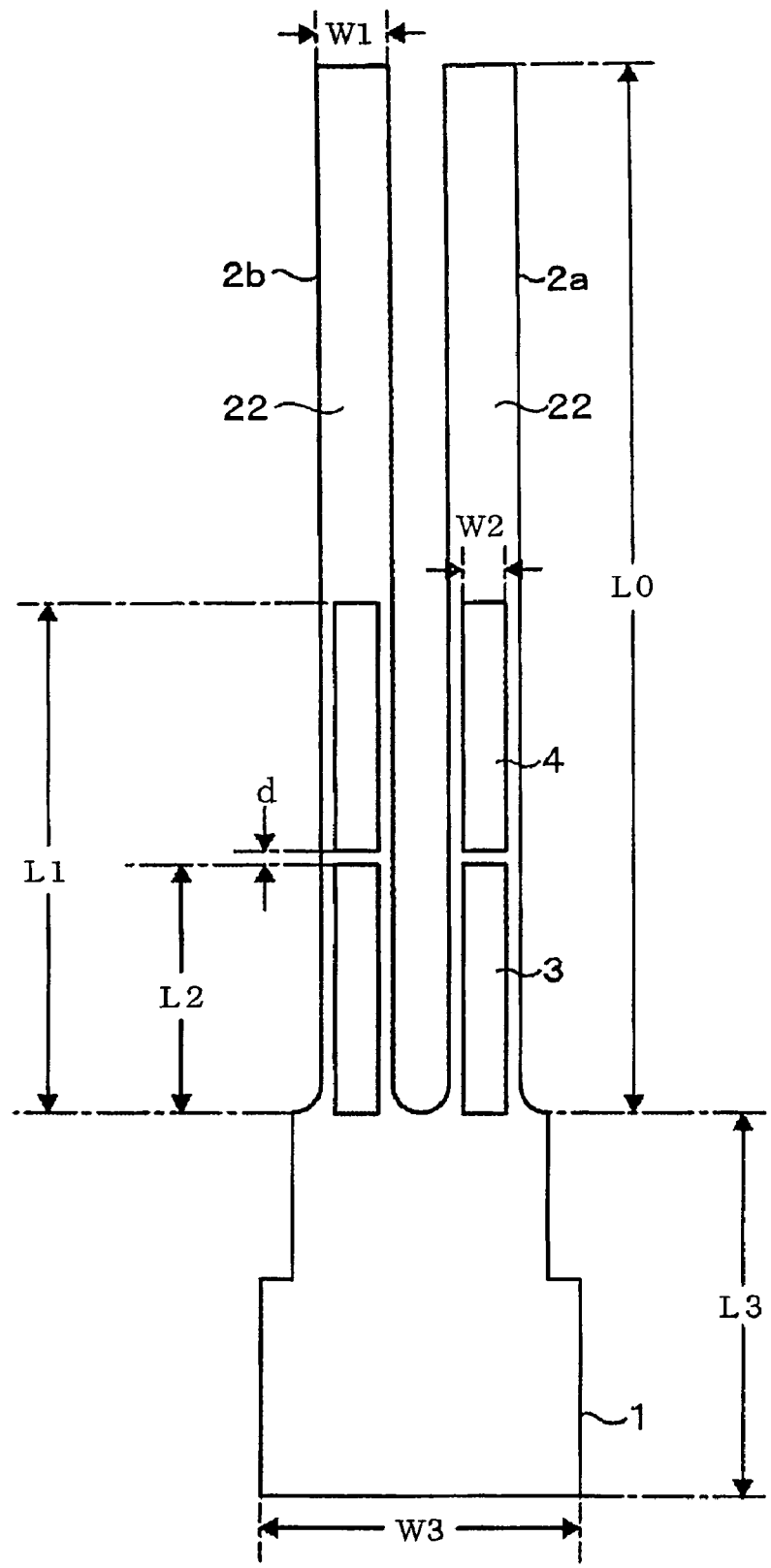
FIG. 3 is an explanatory view showing a size of the above-described tuning fork type quartz vibrator.

An example of respective portion sizes of the quartz vibrator is described referring to FIG. 3. The length L0 of the vibrating arms 2 (2a and 2b) is, for instance, 1650 μm, the length L1 from the base of the first groove 3 to the tip of the second groove 4 is 847 μm, the length L2 of the first groove 3 is, for instance, 418 μm, and the space d from the first groove 3 to the second groove 4 is 10 μm. The length L3 from the bottom surface of the base 1 to the lowest portion 20 of the fork portion of a tuning fork is, for instance, 600 μm. The width W1 of the vibrating arms 2 (2a and 2b) is 100 μm, respective widths W2 of the grooves 3 and 4 are 65 μm, and the width W3 of the bottom surface of the base 1 is 500 μm.

Here, if the ratio L2/L1 of L2 to L1 is 0.35 to 0.65, and if the ratio d/L1 of d to L1 is 0.010 or larger, great shock resistance can be obtained. If the ratio d/L1 is 0.016 or less, the CI value can be small.

Figure 4:
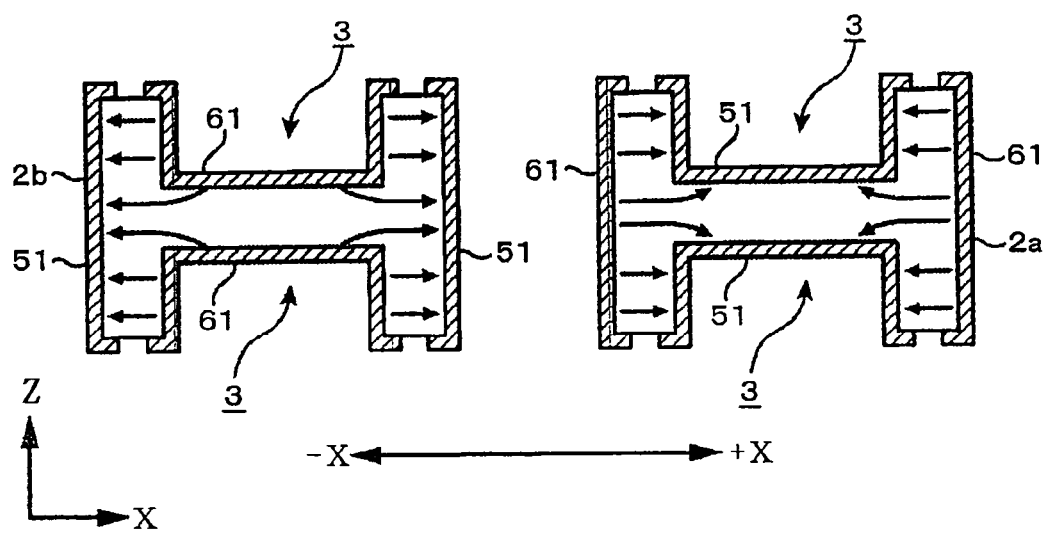
FIG. 4 is a cross section along the line A-A' in FIG. 1.

Next, function and effect of the above-described embodiment will be explained. Both side surfaces 21 and 21 and the main surfaces 22 and 22 of the vibrating arm 2a, and the grooves 3 and 4 of the vibrating arm 2b are at the same potential E1, while both side surfaces 21 and 21 and the main surfaces 22 and 22 of the vibrating arm 2b, and the grooves 3 and 4 of the vibrating arm 2a are at the same potential E2, and E1 and E2 are in an opposite potential with each other. FIG. 4 is a schematic diagram showing an electric line of force generating at the respective vibrating arms 2a and 2b. The electric field intensity in the X-axis direction (in the width direction of the vibrating arms 2) increases owing to the formation of the first groove 3 and the second groove 4, and expansion and contraction occur in the opposite direction between the respective vibrating arms 2a and 2b so that winding vibration in the Y-axis direction is enhanced. Accordingly, vibration efficiency is enhanced and the CI value is reduced. Note that though the sectional shape of the grooves 3 and 4 is depicted in a rectangle for convenience in FIG. 4, actually, the groove width becomes narrower toward the bottom surface in a portion near the bottom surface, owing to an influence of anisotropic etching performed during processing Thus, since grooves are provided on the respective vibrating arms 2a and 2b, the CI value can be reduced. Provision of a groove may weaken the vibrating arms in strength, but in this embodiment, since the groove is divided into two in the longitudinal direction and not provided in single form, in other words, since there provides two grooves of the first groove 3 and the second groove 4, a reduction in strength can be avoided. It should be noted that if the groove is divided into three or more, the CI value will become large as will be seen from a later-described experiment, and such a groove is difficult to be applied to a final product. That is, the structure according to the present invention is based on the conclusion that when grooves are provided on the respective vibrating arms 2a and 2b, division into two is best considering strength and a CI value.

A quartz vibrator package is formed in a manner that the base 1 of the quartz vibrator is fixed on a pedestal in package composed of, for instance, an insulation material with a conductive adhesive so that the quartz vibrator is placed horizontally. Then, an electrode provided on an outside surface of a bottom of the package, and the pull out electrodes 52 and 62 are electrically connected each other via the conductive adhesive and a conductive path in the package. Furthermore, a quartz oscillator is structured by installing the quartz vibrator package and an oscillation circuit oscillating the quartz vibrator on a wiring substrate.

EXPERIMENTAL EXAMPLE

Experiment 1

In a tuning fork type quartz vibrator described in a previously described embodiment, a ratio L2/L1 of the length L2 of the first groove 3 to the length L1 from the base of the first groove 3 to the tip of the second groove 4 was changed variously, and the strength of respective quartz vibrators was checked. The L2/L1 is set in the following 5 ways: 0%, 12.5%, 35%, 50% and 65%, expressed by a percentage % ((L2/L1)×100). 0% means forming one continuous groove without dividing it.

Other conditions are as follows. The length L0 of the vibrating arms 2 (2a and 2b) is 1650 µm, the L1 from the base of the first groove 3 to the tip of the second groove 4 is 847 µm, the space d of the first groove 3 and the second groove 4 is 10 µm, the length L3 from the bottom surface of the base 1 to the lowest portion 20 of the fork portion of the tuning fork is 600 µm, the width W1 of the vibrating arms 2 (2a and 2b) is 100 µm, the width W2 of the groove 3 is 65 µm, and the width W1 of the bottom surface of the base 1 is 500 µm.

Figure 5:
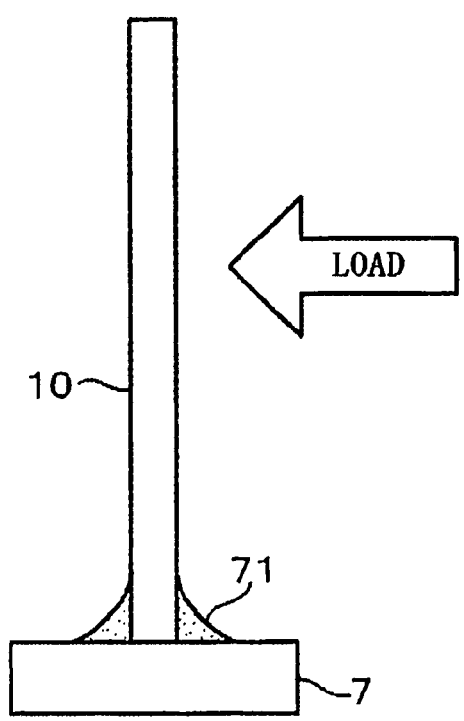
FIG. 5 is a side view showing a destructive testing of a tuning fork type quartz vibrator.
Figure 6:
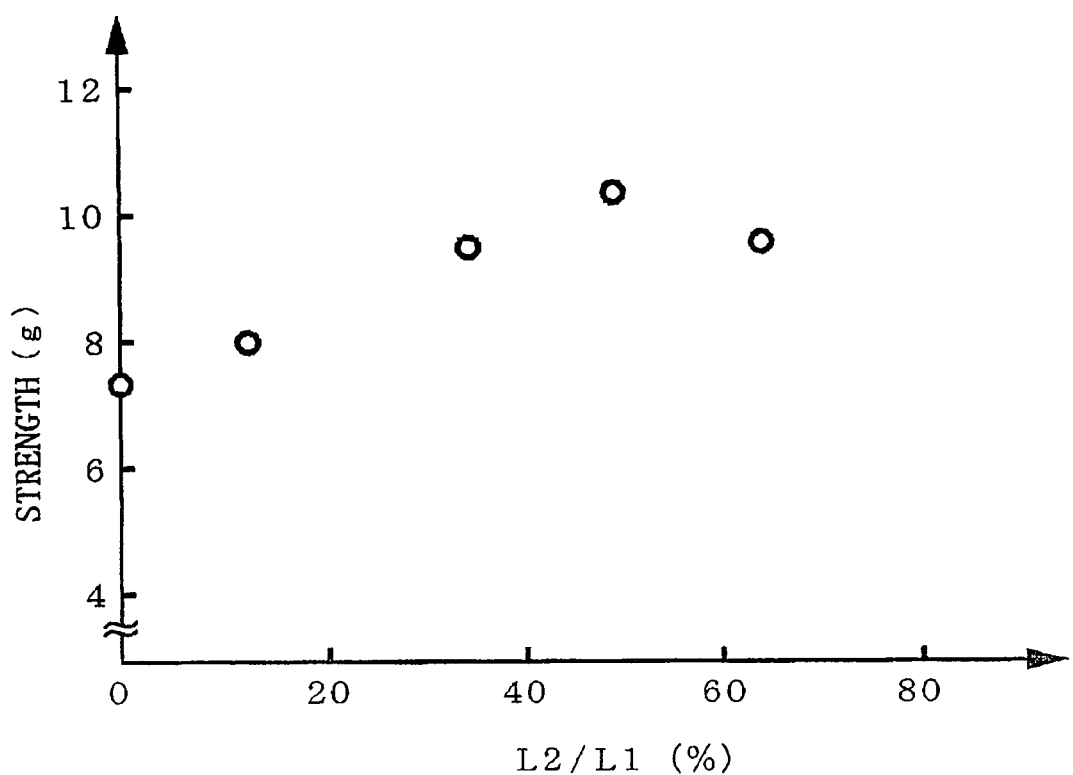
FIG. 6 is a characteristic diagram showing the results of a destructive testing of a tuning fork type quartz vibrator.

A strength test was carried out such that a quartz vibrator 10 was set up perpendicularly on a pedestal 7 as shown in FIG. 5 and was fixed with an adhesive 71, stress was applied to a main surface 22 of the vibrating arms 2 (2a and 2b), and the magnitude of the load when the vibrating arms 2 (2a and 2b) were destroyed was recorded. This test was carried out for three quartz vibrators. The average magnitude of the loads at the time of destruction was determined, and the strength of the quartz vibrators was evaluated. The result is as shown in Table 1 and FIG. 6.

TABLE 1

| d/L1 (%) | First Time (g) | Second Time (g) | Third Time (g) | Average (g) |
|---|---|---|---|---|
| 0 | 7.3 | 8.8 | 6.0 | 7.4 |
| 12.5 | 8.5 | 9.1 | 6.3 | 8.0 |
| 35 | 10.9 | 9.6 | 8.0 | 9.5 |
| 50 | 10.5 | 11.8 | 8.4 | 10.2 |
| 65 | 8.6 | 9.2 | 10.6 | 9.5 |

The strength is 8.0 g when L2/L1 is 12.5%, showing that the strength is greater compared with the result of 7.4 g at 0%. Though there are variations in the strength values in the tests from the first time to the third time, the above-described tendency can be clearly seen. The strength reaches a remarkably great 9.5 g when the ratio L2/L1 is from 35% to 65%. On the other hand, as for the quartz vibrators in the respective conditions, CI values of the respective samples are measured using a CI meter to determine the averages. The result shows that CI value for all quartz vibrators was 53 kΩ. In other words, under these test conditions, the CI values are the same as the case of a single groove, and no increase of CI value owing to dividing into two can be seen. From the above result, it can be said that the strength is increased by dividing the groove into two, and especially that L2/L1 is preferably from 35% to 65% (0.35 to 0.65).

Experiment 2

Figure 7:
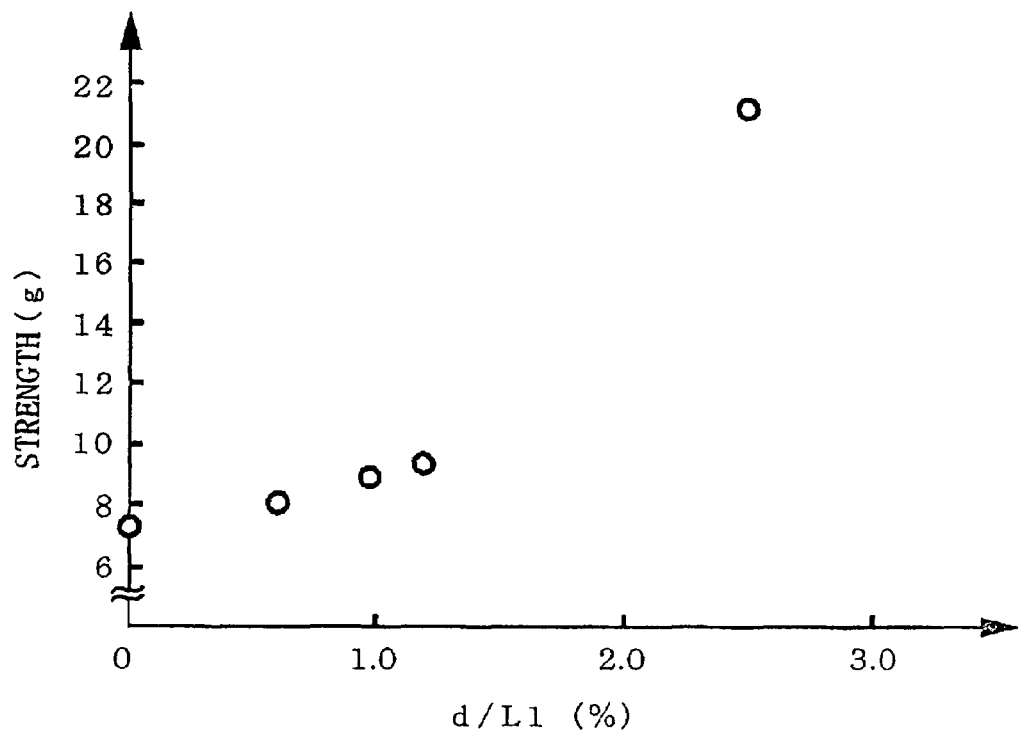
FIG. 7 is a characteristic diagram showing the results of a destructive testing of a tuning fork type quartz vibrator.

Next, an experiment to find an appropriate value of a space d between the first groove 3 and the second groove 4 was carried out. In this experiment, L2/L1 was set to be 35% (0.35), and the space d between the first groove 3 and the second groove 4 was changed variously by changing the position on the base end side of the second groove 4 to set d/L1 in 5 ways: 0%, 0.6%, 1.0%, 1.2%, and 2.51%. Other conditions are the same as in Experiment 1. Strength of each quartz vibrator was examined in the same way as in Example 1. The result is as shown in Table 2 and FIG. 7. Note that the time of d/L1 being 1.2% corresponds to the time of d in the previous Experiment 1 being 10 µm.

TABLE 2

| L2/L1 (%) | First Time (g) | Second Time (g) | Third Time (g) | Average (g) |
|---|---|---|---|---|
| 0 | 7.3 | 8.8 | 6.0 | 7.4 |
| 0.6 | 8.5 | 9.2 | 6.9 | 8.2 |
| 1.0 | 7.8 | 10.3 | 8.9 | 9.0 |
| 1.2 | 10.9 | 9.6 | 8.0 | 9.5 |
| 2.5 | 24 | 19 | 20 | 21 |

Figure 8:
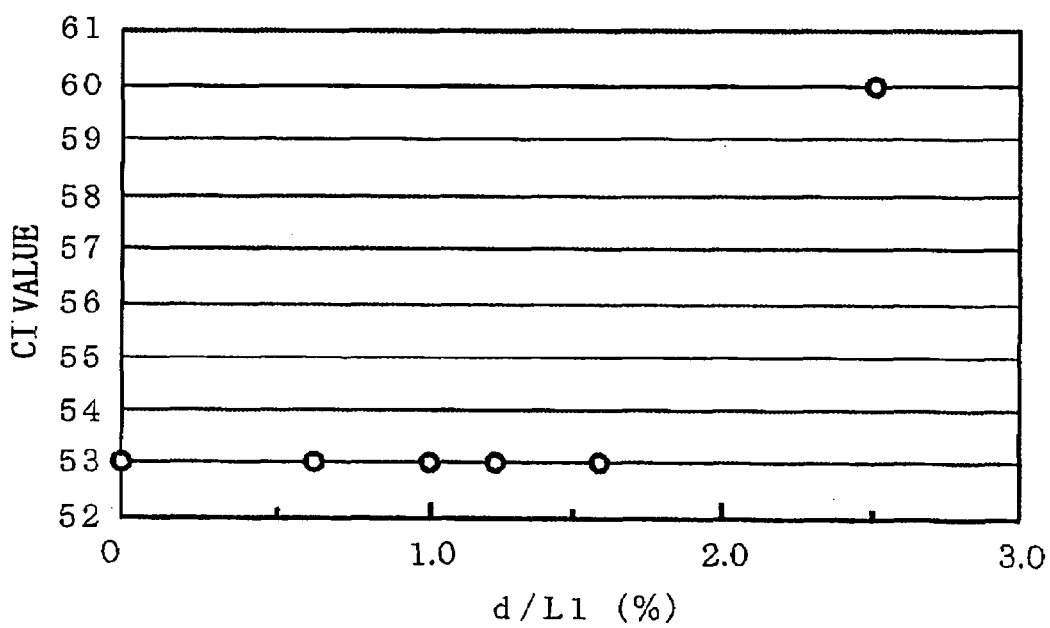
FIG. 8 is a characteristic diagram showing the relation between the space of the groove and the measured CI value in the tuning fork type quartz vibrator.
Figure 9:
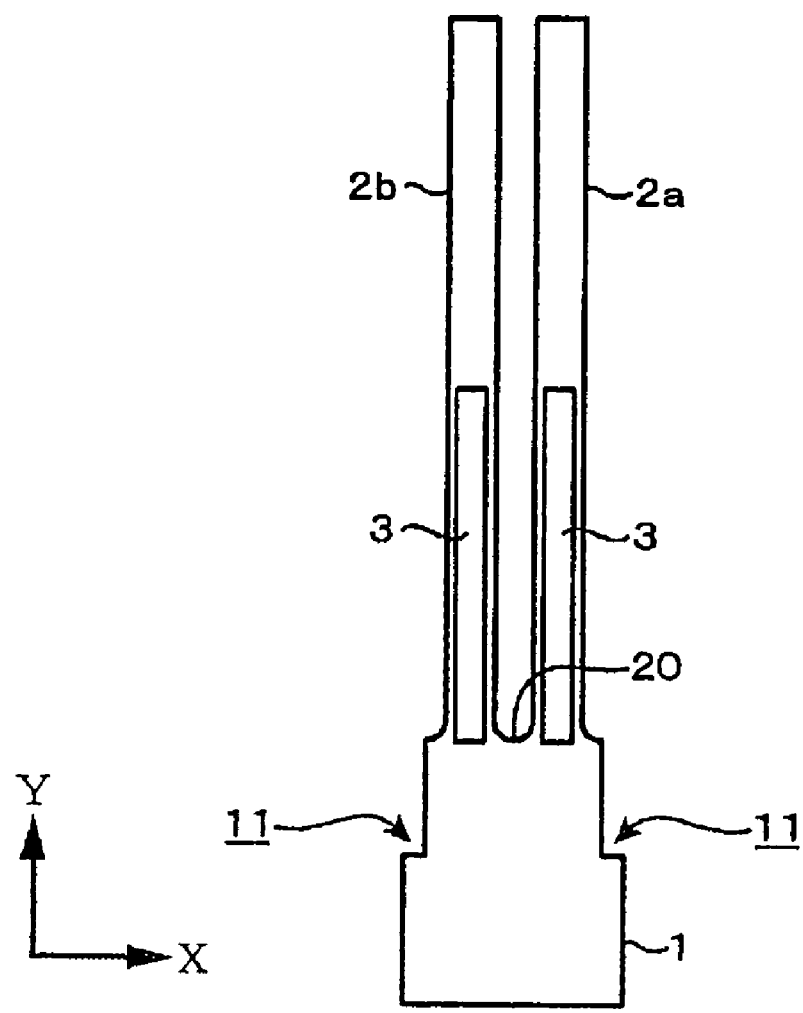
FIG. 9 is a schematic plan view showing a conventional tuning fork type quartz vibrator.

From this result, it can be said that the wider the space d between both grooves 3 and 4, in other words, the greater the d/L1, the greater the strength of the quartz vibrator. Accordingly, when viewed only from the strength of the quartz vibrator, it can be said that the space d should be as large as possible. On the other hand, as for the quartz vibrators under the respective conditions, the CI values of the respective samples were measured using a CI meter to determine the averages thereof. The result shown in Table 3 and FIG. 8 was obtained.

TABLE 3

| d/L1 (%) | CI value (kΩ) |
|---|---|
| 0 | 53 |
| 0.6 | 53 |
| 1.0 | 53 |
| 1.2 | 53 |
| 1.6 | 53 |
| 2.5 | 60 |

From this result, if the space d is made too wide, it is not favorable because the CI value becomes too large. Therefore, the space d should be set to a magnitude so as not to make the CI value too large, and d/L1 should be from 1% to 1.6% (0.010 to 0.016), for instance.

Experiment 3

The groove was divided into three instead of into two, and the spaces d of the respective grooves were made to be 10 µm. Since too small a space d makes machining difficult, in consideration of the time to actually manufacture products, a size of 10 µm was selected. Other conditions were the same as in Example 1. Measurement of a CI value for a quartz vibrator having a groove divided into three resulted in 58 kΩ. Accordingly, the CI value of a quartz vibrator having a groove divided into three is found larger compared with that of a quartz vibrator having a groove divided into two.

The invention claimed is:
1. A piezoelectric vibrator comprising:
 a base having two arms extending from said base in longitudinal directions of the two arms to form a tuning fork body;
 said arms each having a base end whereat said arms are attached to said base, said arms each having a top end at an end opposite said base end;
 each of said arms having a front surface and a back surface, and opposing side surfaces;
 each of said arms having first and second grooves disposed on each of said front surface and said back surface;
 said first and second grooves, on each of said front surface and said back surface, being separated in the longitudinal directions by dividing walls;

said first grooves extending from said base end longitudinally to said dividing walls, said second grooves extending longitudinally from said dividing walls toward said top end of each of said arms and terminating at second groove top ends;

said first and second grooves each having an interior surface including a bottom surface extending longitudinally, said bottom surfaces of said first grooves being disposed opposing one another, and said bottom surfaces of said second grooves being disposed opposing one another;

said dividing walls having a thickness d separating said first and second grooves;

said second groove top ends being disposed a distance L1 from corresponding ones of said base ends of each of said arms;

a ratio of d/L1 being 0.010 to 0.016;

each arm having a first excitation electrode disposed on said opposing side surfaces; and each arm having a second excitation electrode disposed on said interior surfaces of said first and second grooves.

2. The piezoelectric vibrator according to claim 1, wherein:

said first grooves having a longitudinal length L2 from said base ends to said separator wall; and a ratio L2/L1 is 0.35 to 0.15.

3. The piezoelectric vibrator according to claim 1; further comprising:

a package housing said tuning fork body; and electrode provided outside the package housing, and electrically connected to the first and second excitation electrodes.

4. The piezoelectric vibrator according to claim 1, further comprising an oscillation circuit oscillating the tuning fork body.

* * * * *